United States Patent
Jo et al.

(10) Patent No.: US 12,183,492 B2
(45) Date of Patent: Dec. 31, 2024

(54) ROOM-TEMPERATURE MULTIFERROICITY MATERIAL, METHOD FOR PREPARING SAME, AND ELECTRONIC DEVICE COMPRISING SAME

(71) Applicant: UNIST (Ulsan National Institute of Science and Technology, Ulsan (KR)

(72) Inventors: Wook Jo, Ulsan (KR); Jae Hyeon Cho, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 626 days.

(21) Appl. No.: 17/600,440

(22) PCT Filed: Apr. 21, 2020

(86) PCT No.: PCT/KR2020/005267
§ 371 (c)(1),
(2) Date: Sep. 30, 2021

(87) PCT Pub. No.: WO2020/226302
PCT Pub. Date: Nov. 12, 2020

(65) Prior Publication Data
US 2022/0199298 A1  Jun. 23, 2022

(30) Foreign Application Priority Data
May 3, 2019 (KR) .......................... 10-2019-0051988

(51) Int. Cl.
*H01F 1/047* (2006.01)
*H01F 41/02* (2006.01)
(52) U.S. Cl.
CPC ............. *H01F 1/047* (2013.01); *H01F 41/02* (2013.01)

(58) Field of Classification Search
CPC .................................................... H10N 30/852
See application file for complete search history.

(56) References Cited

FOREIGN PATENT DOCUMENTS

| JP | 3605027 | 12/2004 |
|---|---|---|
| KR | 10-2010-0005624 | 1/2010 |

(Continued)

OTHER PUBLICATIONS

Bochenek et al. "Influence of Cobalt Admixture on the Microstructure and Dielectric Properties of PFN Ceramics" Archives of Metallurgy and Materials, 2011, vol. 56, No. 4, pp. 1071-1076. (Year: 2011).*

(Continued)

*Primary Examiner* — Peter F Godenschwager
(74) *Attorney, Agent, or Firm* — EVAN LAW GROUP LLC

(57) ABSTRACT

The present invention relates to a room-temperature multiferroicity material, a method for preparing same, and an electronic device comprising same. According to an example embodiment of the present invention, a room-temperature multiferroicity material according to an aspect of the present disclosure comprises a compound in chemical Formula (2) below in a compound matrix in chemical formula (1) below. Chemical formula (1) $(Pb_{1-x}TM_x)Fe_{1/2}Nb_{1/2}O_3$ (in chemical formula (1), TM comprises at least one selected from the group consisting of Fe, Ni and Co, and x is a number greater than 0 and smaller than 1). Chemical formula (2) $ABO_3$ (in chemical formula (2), A comprises at least one selected from the group consisting of Pb, Bi and Ba, and B comprises Ti and/or Zr).

20 Claims, 8 Drawing Sheets

(56) References Cited

FOREIGN PATENT DOCUMENTS

| | | |
|---|---|---|
| KR | 10-1122631 | 3/2012 |
| KR | 10-1318516 | 10/2013 |
| KR | 10-2017-0128776 | 11/2017 |
| WO | 2006/028005 | 3/2006 |

OTHER PUBLICATIONS

Kumar, A. et al., "Multiferroic Pb(Fe0.66WO.33)0.80Tio.20O3 thin films: A room-temperature relaxor ferroelectric and weak ferromagnetic", Applied Physics Letters, vol. 92, pp. 132913-1-132913-3, (2008).

Wang, Y. et al., "PbTiO$_3$-based perovskite ferroelectric and multiferroic thin films", Physical Chemistry Chemical Physics, vol. 19, issue 27, pp. 17493-17515, (2017). Abstract Only.

International Search Report and Written Opinion dated Jul. 28, 2020 for PCT application No. PCT/KR2020/005267 with English translation.

\* cited by examiner

ROOM-TEMPERATURE MULTIFERROICITY MATERIAL, METHOD FOR PREPARING SAME, AND ELECTRONIC DEVICE COMPRISING SAME

TECHNICAL FIELD

The following description relates to a room-temperature multiferroicity material, a method for preparing the same, and an electronic device including the same.

BACKGROUND ART

Multiferroicity materials may be defined as having a combination of at least two properties of ferromagnetism, ferroelectricity, and ferroelasticity. Since such multiferroicity materials have high potential for completely new applications based on magnetoelectric coupling, in-depth research has recently been conducted on the multiferroicity materials. Further, single-phase multiferroicity materials with ferroelectricity and ferromagnetism operating at room temperature are being studied in depth worldwide, may be applied to next-generation memory devices with high efficiency and high density, and are also expected to be applied to completely new devices, etc.

Nevertheless, multiferroicity materials having ferroelectricity and ferromagnetism at room temperature in order to be applied to electronic devices have not yet been implemented as single-phase bulk materials. Further, in the latest technology, room-temperature multiferroicity materials are mostly limited to $BiFeO_3$ (BFO) or thin-film type ferrimagnetic materials having ferroelectricity and antiferromagnetism. Although the $BiFeO_3$ (BFO) has antiferromagnetism, it has the potential to be used as room temperature single-phase multiferroics, but it has not yet reached the target level according to recent research results. That is, the BFO is not properly synthesized in a bulk shape having a very high electrical resistance. In order to realistically implement and apply these multiferroicity materials, very weak magnetic properties such as antiferromagnetism, etc., relatively low magnetoelectrical coupling, loss of ferroelectricity, etc. need to be overcome. Further, although it is a more important point for commercial applications to form multiferroicity materials in a bulk shape at the same time while allowing the multiferroicity materials to have a single phase, it has not yet been implemented.

Bulk-type multiferroicity materials have been generally known to have antiferromagnetic properties due to strong exchange interactions. To overcome such antiferromagnetic properties, recent research has been focused on manipulating existing multiferroic materials. For example, there is a method of applying a force so that the intrinsic antiferromagnetism is deformed, and, for example, there is a method of transmitting a useful magnetism by allowing an oblique antiferromagnetism to be maintained, transforming the intrinsic antiferromagnetism into ferrimagnetism, or transforming it into a non-intrinsic ferroelectricity. Although these attempts may be conceptually valid, it is questionable whether they can be applied to bulk materials.

In order to find a new breakthrough for multiferroicity materials with magnetoelectric properties, a compositional design for inducing the total magnetism within displaceable ferroelectrics may be proposed. For example, in order for ferroelectricity to be activated, there are requirements that a high level of electrical insulation is required, there must be no inversion symmetry, and so on. In the case of the BFO, antiferromagnetism originates from the antiparallel spin configuration among the B-position ions. Similar properties have been found in typical ferromagnetic materials, for example, nickel ferrite ($NiFe_2O_4$, NFO) with an inverse spinel structure. To be precise, the nickel ferrite is a ferrimagnetic insulator having an inverse spinel structure. Nevertheless, the nickel ferrite is classified as soft ferromagnetic at ambient temperatures. The reason is that it has a fairly high Curie temperature of about 570° C., and has excellent magnetic properties at room temperature. From this point of view, the nickel ferrite may be also referred to as a ferromagnetic material, and may be applied as a room-temperature multiferroicity material accordingly. The nickel ferrite is a cubic dense oxide. Therefore, an oxygen octahedron shares a corner with six neighboring octahedral oxygen octahedra and a surface with eight adjacent oxygen tetrahedra. This means that the perturbation of each oxygen octahedron results in a high degree of local symmetric non-cubic distortion, which may include local destruction in inverse symmetry. In the nickel ferrite, the spin moment from the $Fe^{3+}$ ions located in the middle of the octahedral positions is completely nullified since it has the same amount as the spin moment of $Fe^{3+}$ ions located at the tetrahedral positions, that is, the antiferromagnetic configuration. Nevertheless, the nickel ferrite has ferromagnetism due to an additional ferromagnetic activating element, that is, $Ni^{2+}$ located in the other middle of the octahedral positions, and has, more precisely, ferrimagnetism. There is a high possibility that ferromagnetism (or ferrimagnetism) may be induced into displaceable ferroelectrics such as the BFO by compositional design, such as by additionally introducing ferromagnetic activating elements such as $Ni^{2+}$. However, it is very difficult to form the BFO material in a bulk shape having a sufficiently high electrical resistance to date.

DISCLOSURE OF INVENTION

Technical Goals

The present disclosure is to solve the above-mentioned problems, and an aspect of the present disclosure is to provide a room-temperature multiferroicity material which has ferromagnetism and ferroelectricity at room temperature and has a single phase and a bulk shape at the same time, a method for preparing the same, and an electronic device including the same.

However, the problems to be solved by the present disclosure are not limited to those mentioned above, and other problems not mentioned will be clearly understood by one of ordinary skill in the art from the following description.

Technical Solutions

According to an aspect of the present disclosure, there is provided a room-temperature multiferroicity material including a compound of Chemical Formula 2 below in a compound matrix of Chemical Formula 1 below:

$$(Pb_{1-x}TM_x)Fe_{1/2}Nb_{1/2}O_3 \qquad \text{[Chemical Formula 1]}$$

(In Chemical Formula 1, TM includes at least one selected from the group consisting of Fe, Ni, and Co, and x is a number greater than 0 and less than 1)

$$ABO_3 \qquad \text{[Chemical Formula 2]}$$

(In Chemical Formula 2, A includes at least one selected from the group consisting of Pb, Bi, and Ba, and B includes Ti, Zr, or both).

In an example embodiment, the room-temperature multiferroicity material may be composed of a single phase.

In an example embodiment, the room-temperature multiferroicity material may have an $ABO_3$ perovskite structure.

In an example embodiment, the room-temperature multiferroicity material may exhibit a morphotropic phase boundary (MPB) between rhombohedral and tetragonal multiferroic polymorphs.

In an example embodiment, the rhombohedral and tetragonal structures may have a phase fraction ratio of 40:60 to 60:40.

In an example embodiment, the phase boundary may be confirmed at 0 to 400° C.

In an example embodiment, the room-temperature multiferroicity material may have a higher saturation magnetization and a higher magnetoelectric coefficient than $PbFe_{1/2}Nb_{1/2}O_3$.

In an example embodiment, the room-temperature multiferroicity material may have both ferromagnetism and ferroelectricity.

In an example embodiment, the room-temperature multiferroicity material may have a polarization of 16 nC/cm² or more and a coercive electric field of 300 V/cm or more.

In an example embodiment, the room-temperature multiferroicity material may have a saturation magnetization of 3 emu/g or more and a coercive force of 50 Oe or more.

In an example embodiment, the room-temperature multiferroicity material may have piezoelectricity, and the room-temperature multiferroicity material may have a piezoelectric constant (d33) of 50 to 1000 pC/N.

According to another aspect of the present disclosure, there is provided a method for preparing a room-temperature multiferroicity material, the method including the steps of: forming a first mixture by mixing a lead oxide, an iron oxide, a niobium oxide, and a ferromagnetic element; forming a second mixture by mixing a lead oxide, a bismuth oxide or a barium oxide, and a titanium oxide, a zinc oxide, or both thereof; mixing the first mixture and the second mixture to obtain a mixed mixture; calcining the mixed mixture to obtain a calcined mixture; and sintering the calcined mixture, in which the room-temperature multiferroicity material includes a compound of Chemical Formula 2 below in a compound matrix of Chemical Formula 1 below:

$$(Pb_{1-x}TM_x)Fe_{1/2}Nb_{1/2}O_3$$ 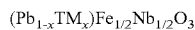 [Chemical Formula 1]

(In Chemical Formula 1, TM includes at least one selected from the group consisting of Fe, Ni, and Co, and x is a number greater than 0 and less than 1)

$$ABO_3$$  [Chemical Formula 2]

(in Chemical Formula 2, A includes Pb, Bi, or Ba, and B includes Ti, Zr, or both).

In an example embodiment, the method may further include a step of performing first ball milling of the mixture between the step of mixing the first mixture and the second mixture and the step of calcining the mixture, and may further include a step of performing second ball milling of the mixture between the step of calcining the mixture to obtain a calcined mixture and the step of sintering the calcined mixture.

In an example embodiment, the method may further include a step of press-molding the mixture to form pellets before performing the step of sintering the calcined mixture.

In an example embodiment, the calcination step may be performed at a temperature ranging from 600 to 900° C. for a period ranging from 1 to 6 hours, and the sintering step may be performed at a temperature ranging from 900 to 1200° C. for a period ranging from 1 to 6 hours.

In an example embodiment, the calcination step and the sintering step may be performed in the air or in an inert atmosphere.

In an example embodiment, the lead oxide may include PbO, the iron oxide may include $Fe_2O_3$, and the niobium oxide may include $Nb_2O_5$.

In an example embodiment, the ferromagnetic element may include at least one selected from the group consisting of $Fe_2O_3$, NiO, and $CoCO_3$.

In an example embodiment, the bismuth oxide may include $Bi_2O_3$, the barium oxide may include BaO, the titanium oxide may include $TiO_2$, and zinc oxide $ZrO_2$ may be included.

According to another aspect of the present disclosure, there is provided an electronic device including a room-temperature multiferroicity material according to an aspect of the present disclosure.

In an example embodiment, the electronic device may be selected from the group consisting of a spintronic device, a high-speed information storage device, a magnetic-electric sensor, a magnetic sensor, an electric sensor, an optoelectronic device, a microwave electronic device, and a transducer.

Effects

A room-temperature multiferroicity material according to an example embodiment of the present disclosure forms a morphotropic phase boundary (MPB), and has a bulk shape at the same time while having a single phase having a strong combination of ferromagnetism and ferroelectricity operable at room temperature.

A room-temperature multiferroicity material which forms a morphotropic phase boundary (MPB), and has a bulk shape at the same time while having a single phase having a strong combination of ferromagnetism and ferroelectricity operable at room temperature may be prepared by a method for preparing a room-temperature multiferroicity material according to an example embodiment of the present disclosure.

An electronic device according to an example embodiment of the present disclosure may be usefully used as various electronic elements having excellent electrical and magnetic properties.

BEST MODE FOR CARRYING OUT THE INVENTION

Figure 1:
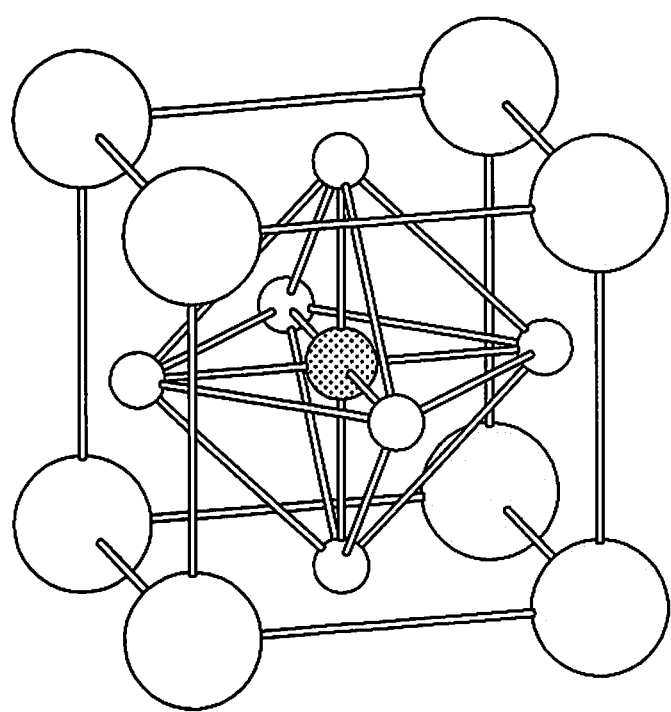
FIGS. 1 and 2 are schematic diagrams for explaining multiferroic properties of a room-temperature multiferroicity material according to an example embodiment of the present disclosure.

Hereinafter, example embodiments of the present disclosure will be described in detail with reference to the accompanying drawings. In the description of the present disclosure, if detailed descriptions of related disclosed art or configuration are determined to unnecessarily make the gist of the present disclosure obscure, they will be omitted. Also, terms used in the present specification, as terms which are used so as to appropriately describe a preferred embodiment of the present disclosure, may be changed depending on the user's or operator's intention or the practices of the field that the present disclosure belongs to. Therefore, the definitions of the terms should be construed based on the contents throughout the present specification. The same reference numerals disclosed in each drawing represent the same members.

In the whole specification, when any member is positioned "on" the other member, this not only includes a case that the any member is brought into contact with the other member, but also includes a case that another member exists between two members.

In the whole specification, if a prescribed part "includes" a prescribed element, this means that another element can be further included instead of excluding another element.

Hereinafter, a room-temperature multiferroicity material according to the present disclosure, a method for preparing the same, and an electronic device including the same will be described in detail with reference to example embodiments and drawings. However, the present disclosure is not limited to such example embodiments and drawings.

According to an aspect of the present disclosure, there is provided a room-temperature multiferroicity material including a compound of Chemical Formula 2 below in a compound matrix of Chemical Formula 1 below:

$(Pb_{1-x}TM_x)Fe_{1/2}Nb_{1/2}O_3$      [Chemical Formula 1]

(In Chemical Formula 1, TM includes at least one selected from the group consisting of Fe, Ni, and Co, and x is a number greater than 0 and less than 1)

$ABO_3$      [Chemical Formula 2]

(In Chemical Formula 2, A includes at least one selected from the group consisting of Pb, Bi, and Ba, and B includes Ti, Zr, or both).

"Room temperature" described in the present specification refers to a normal room temperature, and means not intentionally raising or lowering the temperature. Specifically, the room temperature, for example, may refer to a temperature ranging from 0 to 40° C., for example, may refer to a temperature ranging from 20 to 30° C.

In an example embodiment, a lead-iron-niobium-based compound $((Pb_{1-x}TM_x)Fe_{1/2}Nb_{1/2}O_3)$ of Chemical Formula 1 in which lead is substituted with a ferromagnetic element and a perovskite-based compound $(ABO_3)$ of Chemical Formula 2 are synthesized in order to implement the room-temperature multiferroicity material.

In an example embodiment, the lead-substituted lead-iron-niobium-based compound $((Pb_{1-x}TM_x)Fe_{1/2}Nb_{1/2}O_3)$ is included in a lead-iron-niobium-based compound $(Pb_{1-x}Fe_{1/2}Nb_{1/2}O_3$, PFN) by substituting active elements of ferromagnetic properties. Specifically, the lead-substituted lead-iron-niobium-based compound $((Pb_{1-x}TM_x)Fe_{1/2}Nb_{1/2}O_3$, PFN) of Chemical Formula 1 according to the technical spirit of the present disclosure is a lead-iron-niobium-based compound in which lead located at the A position is substituted by ferromagnetic elements such as nickel, cobalt or iron. The multiferroic properties may be improved by the ferromagnetic elements.

In an example embodiment, the lead-iron-niobium-based compound $((Pb_{1-x}TM_x)Fe_{1/2}Nb_{1/2}O_3)$ in which lead is substituted with a ferromagnetic element has a rhombohedral crystal structure. In an example embodiment, the perovskite-based $(ABO_3)$ compound of Chemical Formula 2 has a tetragonal crystal structure. At this time, A includes at least one selected from the group consisting of Pb, Bi, and Ba, and B includes Ti, Zr, or both.

In an example embodiment, the lead-iron-niobium-based compound $((Pb_{1-x}TM_x)Fe_{1/2}Nb_{1/2}O_3)$ of Chemical Formula 1 substituted with the ferromagnetic element may also be represented by Chemical Formula $ABO_3$. However, the compound of Chemical Formula 1 may have a rhombohedral $ABO_3$ crystal structure, and the compound of Chemical Formula 2 may have a tetragonal $ABO_3$ crystal structure.

Figure 2:
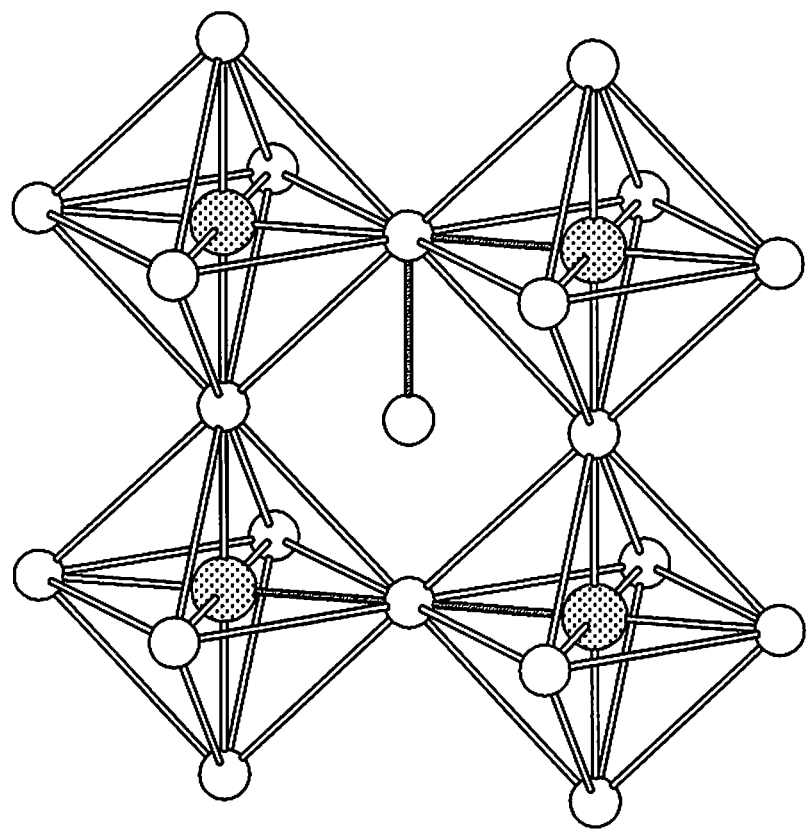

FIGS. 1 and 2 are schematic diagrams for explaining multiferroic properties of a room-temperature multiferroicity material according to an example embodiment of the present disclosure. Referring to FIGS. 1 and 2, it can be seen that each of the compounds of Chemical Formulas 1 and 2 has the same $ABO_3$ crystal structure. Differences are that, since the compounds of Chemical Formulas 1 and 2 are made of different substances, some lattice constants change and are divided into rhombohedral or tetragonal compounds, and the two substances are mixed to form the boundary between two structures (phase boundary). Ferromagnetic properties may be induced in a state that ferroelectricity is maintained when substituting transition elements, that is, common ferromagnetic elements such as iron, cobalt, and nickel at the A position based on a material having an $ABO_3$ perovskite structure with ferroelectric properties and antiferromagnetic properties, for example, a lead-iron-niobium-based compound. A 180 degree superbonding interaction may be transformed into a 90 degree interaction. Although the magnetic moments cancel each other to have diamagnetic properties when the superbonding interaction is 180 degrees coupled, the magnetic moments are aligned with each other in the same direction and have ferroelectric properties when the superbonding interaction is 90 degrees coupled.

In an example embodiment, the crystal structure of Chemical Formula 1 having the rhombohedral crystal phase may induce a phase boundary by using the perovskite-based (ABO$_3$) compound of Chemical Formula 2 above. It may have improved multiferroicity due to crystal structure deformation. In an example embodiment, the room-temperature multiferroicity material may be composed of a single phase. Being composed of a single phase means that it is composed of one phase and is not separated into two or more phases, and may have a single crystal or a polycrystal from a crystal structure point of view. The room-temperature multiferroicity material may have a polycrystalline bulk shape or a single crystal shape.

In an example embodiment, the room-temperature multiferroicity material may have an ABO$_3$ perovskite structure.

In an example embodiment, the room-temperature multiferroicity material may exhibit a morphotropic phase boundary (MPB) between rhombohedral and tetragonal multiferroic polymorphs. In addition, phase boundary induction may be possible by adding some materials having different structures.

In an example embodiment, the rhombohedral and tetragonal structures may have a phase fraction ratio of 40:60 to 60:40. When ABO$_3$ perovskite of Chemical Formula 2 is doped in a certain amount or more, for example, 0.01 to 0.5 mol, the phase fraction ratio of the rhombohedral and tetragonal structures may be maintained to 40:60 to 60:40.

In an example embodiment, the phase boundary may be confirmed at 0 to 400° C. Preferably, the phase boundary may be confirmed at 10 to 50° C., and may be confirmed at 20 to 40° C.

In an example embodiment, the room-temperature multiferroicity material may have a higher saturation magnetization and a higher magnetoelectric coefficient than PbFe$_{1/2}$Nb$_{1/2}$O$_3$. Accordingly, the room-temperature multiferroicity material may have ferromagnetism and ferroelectricity.

In an example embodiment, the room-temperature multiferroicity material may have both ferromagnetism and ferroelectricity. This means that it has strong magnetic properties (ferromagnetism) and electrical properties (ferroelectricity) at the same time, and the room-temperature multiferroicity material according to the present disclosure has multiferroicity at room temperature as described above. Accordingly, there is an effect that it may be applied as a material for a pyroelectric element, a piezoelectric element, and a ferroelectric memory device.

In an example embodiment, the room-temperature multiferroicity material may have a polarization of 16 nC/cm$^2$ or more and a coercive electric field of 300 V/cm or more. However, even when the room-temperature multiferroicity material has a polarization of less than 16 nC/cm$^2$ and a coercive electric field of less than 300 V/cm, the phase boundary of the present disclosure may be induced to contribute to the improvement of electrical properties.

In an example embodiment, the room-temperature multiferroicity material may have a saturation magnetization of 3 emu/g or more and a coercive force of 50 Oe or more. In the above ranges, the effect of improving magnetic properties according to the induction of the phase boundary has been confirmed.

In an example embodiment, the room-temperature multiferroicity material may have piezoelectricity, and the room-temperature multiferroicity material may have a piezoelectric constant (d33) of 50 to 1000 pC/N.

The term "piezoelectric" in the present specification refers to an action of mutual conversion between mechanical energy and electrical energy through a medium of a piezoelectric body, and refers to an effect of generating electricity when pressure or vibration (mechanical energy) is applied. Indices indicating such piezoelectric performance include piezoelectric constants ($d_{33}$ and $d_{31}$), etc. At this time, the piezoelectric constant refers to the degree displaced when an electric field (V/m) is applied, or vice versa, and the larger the piezoelectric constant, the greater the advantage of enabling micro-displacement control.

A room-temperature multiferroicity material according to an example embodiment of the present disclosure forms a morphotropic phase boundary (MPB), has a strong combination of piezoelectricity as well as ferromagnetism and ferroelectricity operable at room temperature, and has a single phase and a bulk shape at the same time.

Since a room-temperature multiferroicity material according to an example embodiment of the present disclosure is applicable to all conventional multiferroic materials, its utility and expected effects are expected to be excellent.

According to another aspect of the present disclosure, there is provided a method for preparing a room-temperature multiferroicity material, the method including the steps of: forming a first mixture by mixing a lead oxide, an iron oxide, a niobium oxide, and a ferromagnetic element; forming a second mixture by mixing a lead oxide, a bismuth oxide or a barium oxide, and a titanium oxide, a zinc oxide, or both thereof; mixing the first mixture and the second mixture to obtain a mixed mixture; calcining the mixed mixture to obtain a calcined mixture; and sintering the calcined mixture, in which the room-temperature multiferroicity material includes a compound of Chemical Formula 2 below in a compound matrix of Chemical Formula 1 below:

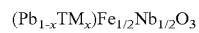

$(Pb_{1-x}TM_x)Fe_{1/2}Nb_{1/2}O_3$      [Chemical Formula 1]

(In Chemical Formula 1, TM includes at least one selected from the group consisting of Fe, Ni, and Co, and x is a number greater than 0 and less than 1)

$ABO_3$      [Chemical Formula 2]

(In Chemical Formula 2, A includes Pb, Bi, or Ba, and B includes Ti, Zr, or both).

In an example embodiment, the lead-substituted lead-iron-niobium-based compound $((Pb_{1-x}TM_x)Fe_{1/2}Nb_{1/2}O_3)$ of Chemical Formula 1 and the perovskite-based compound $(ABO_3)$ of Chemical Formula 2 are synthesized in order to implement the room-temperature multiferroicity material.

Figure 3:
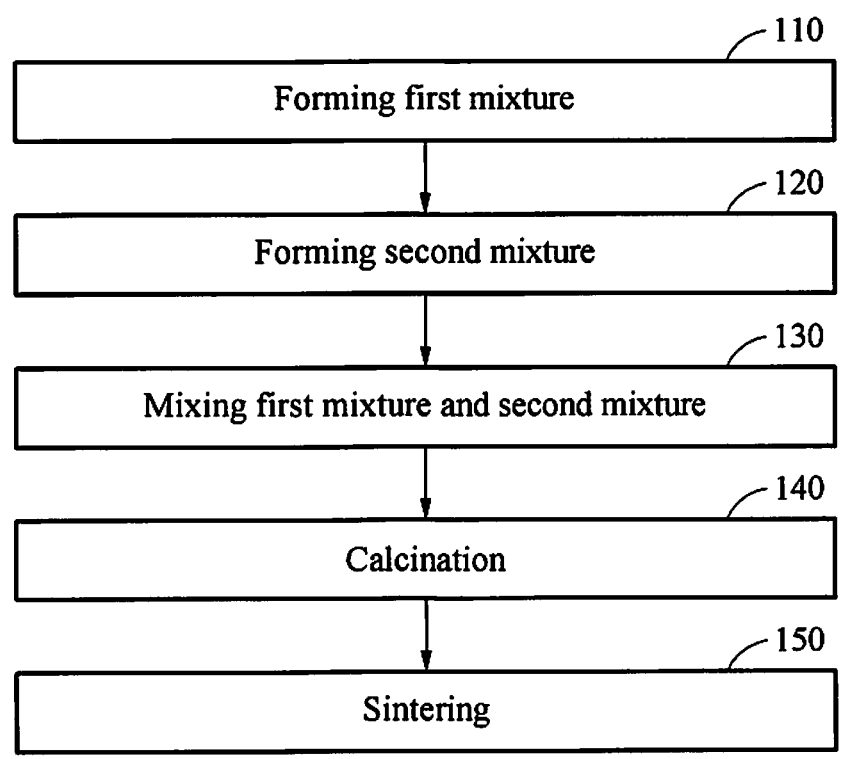
FIG. 3 is a flowchart illustrating a method for preparing a room-temperature multiferroicity material according to an example embodiment of the present disclosure.

FIG. 3 is a flowchart illustrating a method for preparing a room-temperature multiferroicity material according to an example embodiment of the present disclosure. Referring to FIG. 3, the method for preparing a room-temperature multiferroicity material according to an example embodiment of the present disclosure may include: a step 110 of forming a first mixture; a step 120 of forming a second mixture; a step 130 of mixing the first mixture and the second mixture; a calcination step 140; and a sintering step 150.

In an example embodiment, the method may further include a step of performing first ball milling of the mixture between the step of mixing the first mixture and the second mixture and the step of calcining the mixture, and may further include a step of performing second ball milling of the mixture between the step of calcining the mixture to obtain a calcined mixture and the step of sintering the calcined mixture.

In an example embodiment, the method may further include a step of press-molding the mixture to form pellets before performing the step of sintering the calcined mixture.

Figure 4:
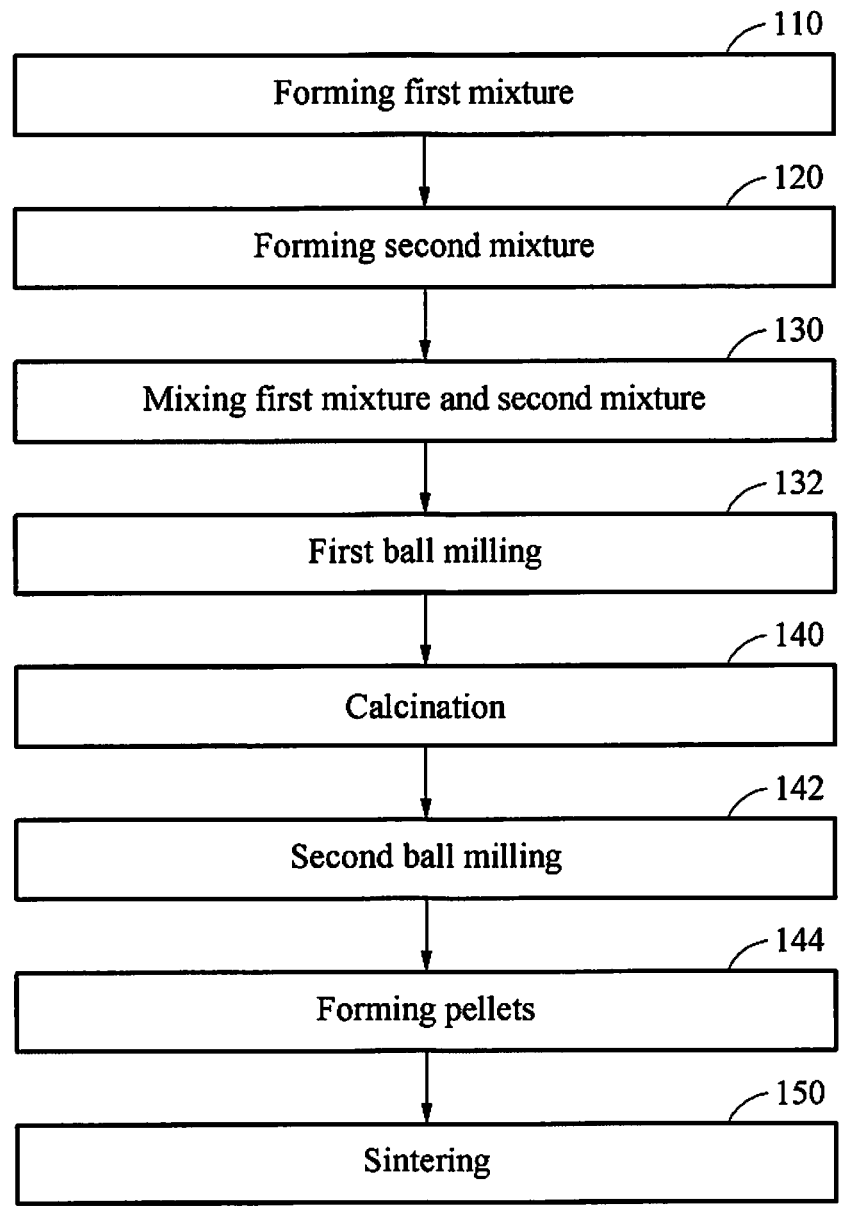
FIG. 4 is a flowchart illustrating a method for preparing a room-temperature multiferroicity material according to another embodiment of the present disclosure.

FIG. 4 is a flowchart illustrating a method for preparing a room-temperature multiferroicity material according to another embodiment of the present disclosure. Referring to FIG. 4, the method for preparing a room-temperature multiferroicity material according to another embodiment of the present disclosure may include: a step 110 of forming a first mixture; a step 120 of forming a second mixture; a step 130 of mixing the first mixture and the second mixture; a first ball milling step 132; a calcination step 140; a second ball milling step 142; a pellet forming step 144; and a sintering step 150.

In an example embodiment, the step 110 of forming a first mixture may be forming a first mixture by mixing a lead oxide, an iron oxide, a niobium oxide, and a ferromagnetic element.

In an example embodiment, the lead oxide may include PbO, the iron oxide may include $Fe_2O_3$, and the niobium oxide may include $Nb_2O_5$. The amounts of the lead oxide, the iron oxide, and the niobium oxide to be mixed may be determined depending on the desired chemical composition of a final multiferroicity material.

In an example embodiment, the ferromagnetic element may include at least one selected from the group consisting of $Fe_2O_3$, NiO, and $CoCO_3$.

In an example embodiment, the step 120 of forming a second mixture may be forming a second mixture by mixing a lead oxide, a bismuth oxide or a barium oxide, and a titanium oxide, a zinc oxide, or both thereof.

In an example embodiment, the bismuth oxide may include $Bi_2O_3$, the barium oxide may include BaO, the titanium oxide may include $TiO_2$, and zinc oxide $ZrO_2$ may be included.

In an example embodiment, the step 130 of mixing the first mixture and the second mixture may be mixing the first mixture and the second mixture.

In an example embodiment, the first ball milling step 132 may be performed using deionized water and zirconia balls. For example, the first ball milling step may be carried out at a temperature ranging from 20 to 30° C. for a period ranging from 4 to 8 hours. Preferably, the first ball milling step may be performed at a temperature of 25° C. for 6 hours or more.

In an example embodiment, the calcination step 140 may be calcining the mixed mixture.

In an example embodiment, the calcination step 140 may be putting the mixed mixture into a high-temperature furnace and performing calcination in order to grow particles of the mixed mixture.

In an example embodiment, the calcination step may be performed at a temperature ranging from 600 to 900° C. for a period ranging from 1 to 6 hours. The reaction between raw material powders becomes insufficient when the calcination is carried out at a temperature of less than 600° C., and difficulty in pulverization occurs when the calcination is carried out at a temperature of more than 900° C.

In an example embodiment, the temperature increase/decrease rate may be 3 to 7° C./min. The temperature distribution of the raw material powders becomes uneven if the temperature increase/decrease rate is too fast, and there is a problem that the process time becomes long if it is too slow.

In an example embodiment, the calcination step may be performing calcination each time when there is a composition to be added.

In an example embodiment, the second ball milling step 142 may be performed using deionized water and zirconia balls. For example, the second ball milling step may be carried out at a temperature ranging from 20 to 30° C. for a period ranging from 5 to 15 hours. Preferably, the second ball milling step may be performed at a temperature of 25° C. for 12 hours or more.

In an example embodiment, the pellet forming step 144 may be forming a molded body by putting the mixture which has completed calcination and ball milling into, for example, a cylindrical mold having a diameter of 10 T, and molding the mixture at a pressure of 0.3 to 3 ton/cm². At this time, a small amount (e.g., 1% by weight) of a binder (e.g., polyvinyl alcohol (PVA)) may be added to a calcined powder in order to facilitate molding of the mixture. Thereafter, a heat treatment process may be performed in a high-temperature furnace at 600 to 700° C. for 2 to 4 hours in order to evaporate both the binder and some moisture (e.g., adsorbed water [$H_2O$] and adhered water [OH]). Here, the temperature increase/decrease rate may be 3 to 7° C./min, and the temperature increase/decrease may be performed for about 2 hours. For example, 0.5 g of pellets may be molded under a weight of 2 tons by the pellet step.

In an example embodiment, the sintering step 150 may be forming a sintered body by putting the molded body back into the high-temperature furnace and sintering the molded body. The sintered body may have a perovskite crystal structure.

In an example embodiment, the sintering step may be performed at a temperature ranging from 900 to 1200° C. for a period ranging from 1 to 6 hours. The perovskite crystallinity is not sufficient since sintering is not sufficient at a temperature of less than 900° C. during the sintering process, and the particle size becomes too large, and defects in the structure may occur due to volatilization, etc. of the ferromagnetic element at a temperature of more than 1200° C.

In an example embodiment, the temperature increase/decrease rate may be 3 to 7° C./min. The temperature distribution of the raw material powders becomes uneven if the temperature increase/decrease rate is too fast, and there is a problem that the process time becomes long if it is too slow.

In an example embodiment, the calcination step and the sintering step may be performed in the air or in an inert atmosphere.

A room-temperature multiferroicity material according to an example embodiment of the present disclosure may be formed by using the above-described method for preparing the room-temperature multiferroicity material.

A room-temperature multiferroicity material which forms a morphotropic phase boundary (MPB), and has a bulk shape at the same time while having a single phase having a strong combination of ferromagnetism and ferroelectricity operable at room temperature may be prepared by a method for preparing a room-temperature multiferroicity material according to an example embodiment of the present disclosure.

According to another aspect of the present disclosure, there is provided an electronic device including the room-temperature multiferroicity material according to an aspect of the present disclosure.

An electronic device according to an example embodiment of the present disclosure is manufactured using the room-temperature multiferroicity material, and since the specific content of the "room-temperature multiferroicity material" is the same as described above, a redundant description thereof will be omitted.

In an example embodiment, the electronic device may be selected from the group consisting of a spintronic device, a high-speed information storage device, a magnetic-electric sensor, a magnetic sensor, an electric sensor, an optoelectronic device, a microwave electronic device, and a transducer.

An electronic device according to an example embodiment of the present disclosure may be usefully used as various electronic elements having excellent electrical and magnetic properties.

Hereinafter, the present disclosure will be described in more detail by Examples and Comparative Example.

However, the following Examples just exemplify the present disclosure, and the contents of the present disclosure are not limited to the following Examples.

Example

Preparation of Room-Temperature Multiferroicity Material

A mixture 1, i.e., a lead-iron-niobium-based compound in which the bulk-type A position was substituted with a ferromagnetic element, as a compound of Chemical Formula 1, was prepared by using the above-described method for preparing a room-temperature multiferroicity material.

PbO (99.9%, Sigma-Aldrich), $Fe_2O_3$ (99%, Sigma-Aldrich), $Nb_2O_5$ (99.99%, Sigma-Aldrich), NiO (99.8%, Sigma-Aldrich), and $CoCO_3$ (99.5%, Alfa-Aesar) were each prepared as a powder and dried at 100° C. for 24 hours.

Subsequently, a mixture 2 of a perovskite structure was prepared as a material of Chemical Formula 2 by using the above-described method for preparing a room-temperature multiferroicity material.

PbO (99.9%, Sigma-Aldrich) and $TiO_2$ (99%, Sigma-Aldrich) were each prepared as a powder and dried at 100° C. for 24 hours.

The mixture of Chemical Formula 1 and the mixture of Chemical Formula 2 were weighed and mixed to a desired chemical composition. A bulk pellet sample was manufactured from a mixture having the first mixture and the second mixture mixed therein by using a usual solid-phase sintering method. Specifically, the first ball milling step was performed at a temperature of 25° C. for 3 hours. The calcination step was performed at a temperature of 800° C. for 2 hours. The second ball milling step was performed at a temperature of 25° C. for 12 hours. In the pellet forming step, 0.5 g of pellets were formed under a weight of 2 tons. The formation of a room-temperature multiferroicity material by sintering the pellets was carried out at a temperature of 1100° C. for 2 hours.

Method for Measuring Properties of Room-Temperature Multiferroicity Material

In order to analyze the crystal structure of a room-temperature multiferroicity material, X-ray diffraction (XRD, D/MAX2500V/PC, Rigaku) measurements were performed, and Cu-Kα radiation, a 2θ range of 20 to 80 degrees, and a step size of 0.02 degrees were used.

In order to analyze ferromagnetic properties and magnetic Curie temperature of the room-temperature multiferroicity material, magnetic hysteresis loops were measured using a vibrating sample magnetometer (VSM, VSM7300) and a physical property measurement system (PPMS, Quantum Design). The magnetic field level was 10000 Oe or less.

The magnetoelectric coupling effect of the room-temperature multiferroicity material was analyzed. Prior to magnetoelectric measurement, composition-made PFN bulk samples were DC-polarized at 1 kV/mm for 20 minutes at room temperature. In order to measure magnetoelectric coefficients, a lock-in amplifier (SR850), a bipolar amplifier (BA4825), a DC current amplifier (BOP 36-12ML), a DC electromagnet, and a Helmholtz coil were used. Voltage changes in response to a sinusoidal alternating magnetic field of 1 Oe at 1 kHz induced by the Helmholtz coil were measured every 0.1 second, and the alternating magnetic field was swept over two successive sidles with a uniform magnetic field loading/unloading rate.

In order to analyze ferroelectricity of the room-temperature multiferroicity material, polarizations and strain hysteresis loops were measured using a piezoelectric measurement system (aixACCT aixPES, Aachen, Germany). The specimen used for measurement had a disk shape with a thickness of 1 mm and a diameter of 10 mm, and was measured at a magnetic field intensity of 2.5 kV/mm at a measurement frequency of 10 Hz. The piezoelectric coefficient (d33) was measured using a d33 measuring instrument (YE2730A) at a frequency of 110 Hz. The temperature dependent permittivity and dielectric loss were measured using an impedance measuring instrument (HP4192A).

Dielectric constants of the room-temperature multiferroicity material were measured using an impedance measuring instrument (HP4192A) in a measurement frequency range of 100 Hz to 40 MHz at room temperature. For dielectric measurement under magnetic field, wired disk-shaped specimens were placed in parallel with a separation distance of 60 mm at the center of two flat-type neodymium magnets having a size of 40 mm×60 mm×15 mm.

The magnetic hysteresis loops of the room-temperature multiferroicity material were measured using a vibrating sample magnetometer (VSM, VSM7300, LakeShore Cryotronics) and a physical property measurement system (PPMS, Quantum Design).

Analysis of Properties of Room-Temperature Multiferroicity Materials

Table I is a table showing a room-temperature multiferroicity material according to an example embodiment of the present disclosure.

TABLE 1

| | Abbreviated name | Chemical composition | Substituting substance and molar ratio |
|---|---|---|---|
| Comparative Example | Pristine PFN-6PT | $0.94(PbFe_{1/2}Nb_{1/2}O_3)$-$0.06(PbTiO_3)$ | None |
| Example 1 | PNFN10-6PT | $0.94(Pb_{0.9}Ni_{0.1}Fe_{1/2}Nb_{1/2}O_3)$-$0.06(PbTiO_3)$ | Ni, 10 mol % |
| Example 2 | PNFN20-6PT | $0.94(Pb_{0.9}Ni_{0.2}Fe_{1/2}Nb_{1/2}O_3)$-$0.06(PbTiO_3)$ | Ni, 20 mol % |
| Example 3 | PCFN10-6PT | $0.94(Pb_{0.9}Co_{0.1}Fe_{1/2}Nb_{1/2}O_3)$-$0.06(PbTiO_3)$ | Co, 10 mol % |
| Example 4 | PCFN20-6PT | $0.94(Pb_{0.9}Co_{0.2}Fe_{1/2}Nb_{1/2}O_3)$-$0.06(PbTiO_3)$ | Co, 20 mol % |

Figure 5:
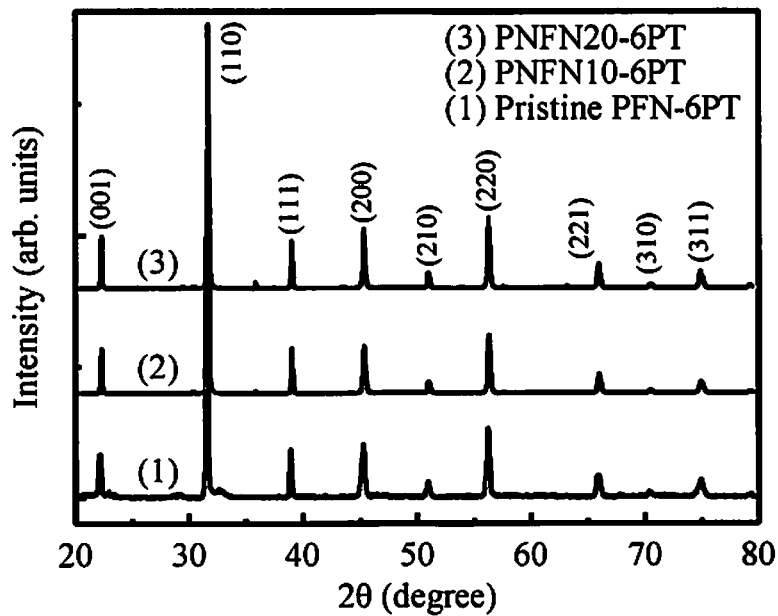
FIG. 5 is a graph showing X-ray diffraction patterns of room-temperature multiferroicity materials according to Comparative Example and Examples 1 and 2 of the present disclosure (when replacing lead with nickel).
Figure 6:
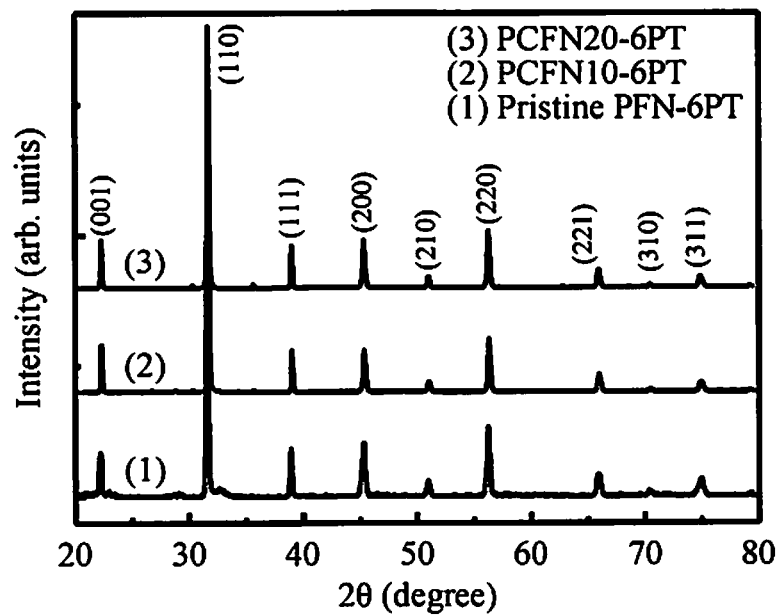
FIG. 6 is a graph showing X-ray diffraction patterns of room-temperature multiferroicity materials according to Comparative Example and Examples 3 and 4 of the present disclosure (when replacing lead with cobalt).

FIG. 5 is a graph showing X-ray diffraction patterns of room-temperature multiferroicity materials according to Comparative Example and Examples 1 and 2 of the present disclosure (when replacing lead with nickel), and FIG. 6 is a graph showing X-ray diffraction patterns of room-temperature multiferroicity materials according to Comparative Example and Examples 3 and 4 of the present disclosure (when replacing lead with cobalt). Referring to FIGS. 5 and 6, X-ray diffraction patterns of respective compounds $0.94(Pb_{0.9}Ni_{0.1}Fe_{1/2}Nb_{1/2}O_3)$-$0.06(PbTiO_3)$, 0.94

$(Pb_{0.9}Ni_{0.2}Fe_{1/2}Nb_{1/2}O_3)$-0.06$(PbTiO_3)$, 0.94$(Pb_{0.9}Co_{0.1}Fe_{1/2}Nb_{1/2}O_3)$-0.06$(PbTiO_3)$, and 0.94$(Pb_{0.9}Co_{0.2}Fe_{1/2}Nb_{1/2}O_3)$-0.06$(PbTiO_3)$ as room-temperature multiferroicity materials are shown. Peaks appear at the same angle in all samples, and no particular peak occurrence appears.

Therefore, even when lead at the A position is substituted with a ferromagnetic element such as nickel or cobalt in a lead-iron-niobium-based compound, it can be seen that a perovskite structure of the same single phase in which the secondary phase does not appear until at least 20 mol % of the ferromagnetic element is substituted with respect to lead may be maintained. This indicates that the level of substitution introduced is excellent within the structural resistance limit of the initial structure. However, it was shown that the lattice constant decreased as the degree of substitution with the ferromagnetic element increased.

Figure 7:
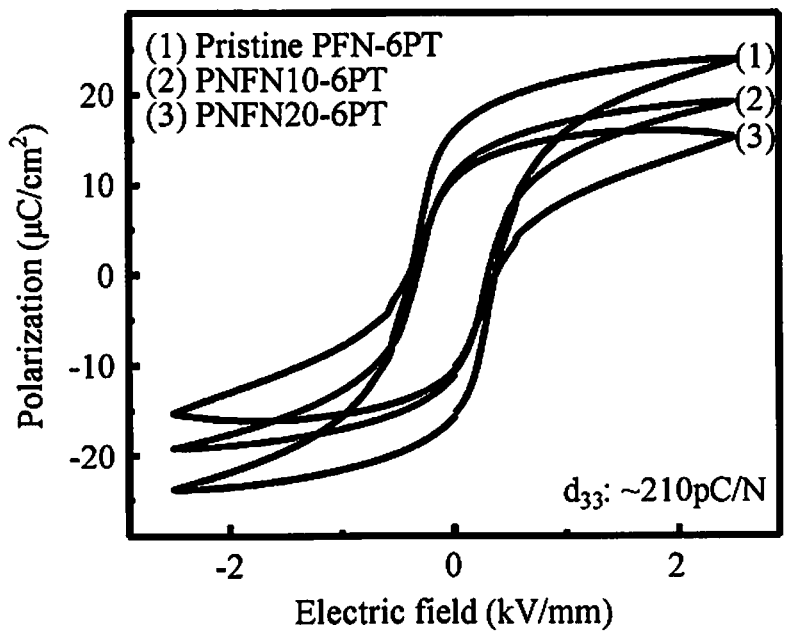
FIG. 7 is a graph showing ferroelectric properties of room-temperature multiferroicity materials according to Comparative Example and Examples 1 and 2 of the present disclosure (when replacing lead with nickel).
Figure 8:
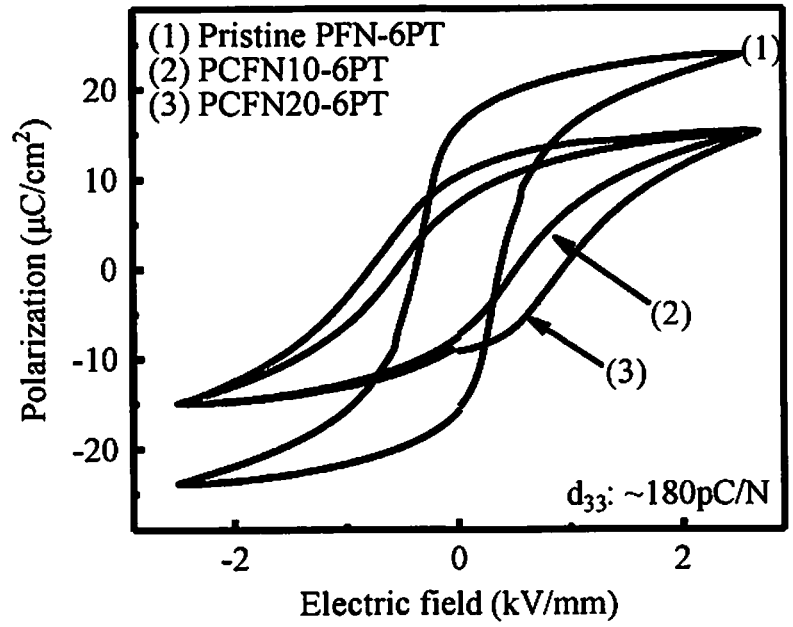
FIG. 8 is a graph showing ferroelectric properties of room-temperature multiferroicity materials according to Comparative Example and Examples 3 and 4 of the present disclosure (when replacing lead with cobalt).

FIG. 7 is a graph showing ferroelectric properties of room-temperature multiferroicity materials according to Comparative Example and Examples 1 and 2 of the present disclosure (when replacing lead with nickel), and FIG. 8 is a graph showing ferroelectric properties of room-temperature multiferroicity materials according to Comparative Example and Examples 3 and 4 of the present disclosure (when replacing lead with cobalt).

Referring to 7 and 8, as results of applying electric fields ranging from −2.5 to +2.5 kV/mm to 0.94$(Pb_{0.9}Ni_{0.1}Fe_{1/2}Nb_{1/2}O_3)$-0.06$(PbTiO_3)$, 0.94$(Pb_{0.9}Ni_{0.2}Fe_{1/2}Nb_{1/2}O_3)$-0.06$(PbTiO_3)$, 0.94$(Pb_{0.9}Co_{0.1}Fe_{1/2}Nb_{1/2}O_3)$-0.06$(PbTiO_3)$, and 0.94$(Pb_{0.9}Co_{0.2}Fe_{1/2}Nb_{1/2}O_3)$-0.06$(PbTiO_3)$ respectively at a measurement frequency of 10 Hz, polarization hysteresis loops sufficiently saturated in the bulk size at room temperature were shown and electrical polarizations of typical ferroelectric properties were also clearly shown with respect to all compositions of bulk-sized room-temperature multiferroicity materials. Further, abrupt changes in the coercive force were not appeared in lead-iron-niobium-based compounds before substitution and lead-iron-niobium-based compounds each of which had been substituted with nickel respectively, and some changes were appeared in the case of cobalt. On the other hand, as the substitution of the ferromagnetic element increased, the maximum electric polarization value and the maximum residual electric polarization value showed a decreasing trend. Further, the piezoelectric constant ($d_{33}$) was found to be up to ~200 pC/N.

Figure 9:
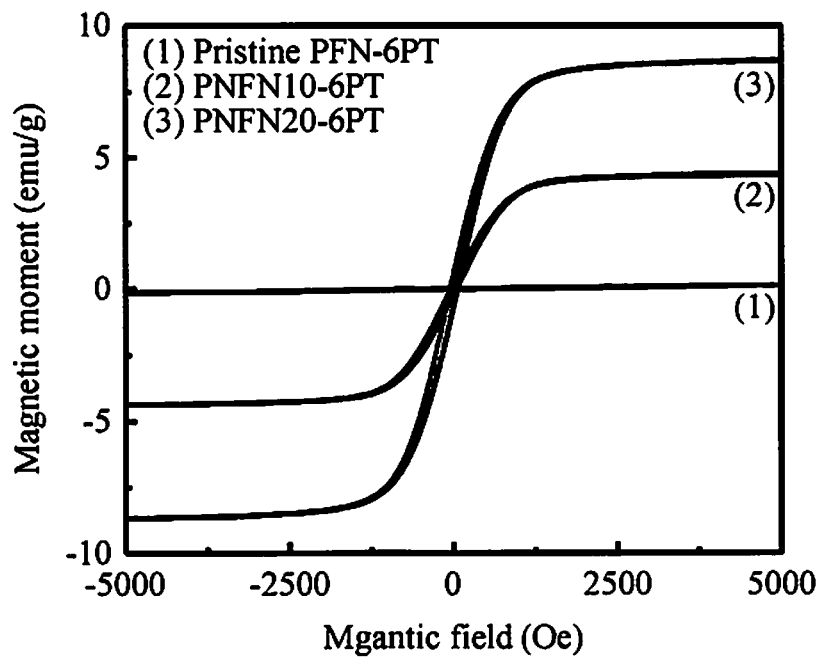
FIG. 9 is a graph showing magnetization properties of multiferroicity materials according to Comparative Example and Examples 1 and 2 of the present disclosure (when replacing lead with nickel).
Figure 10:
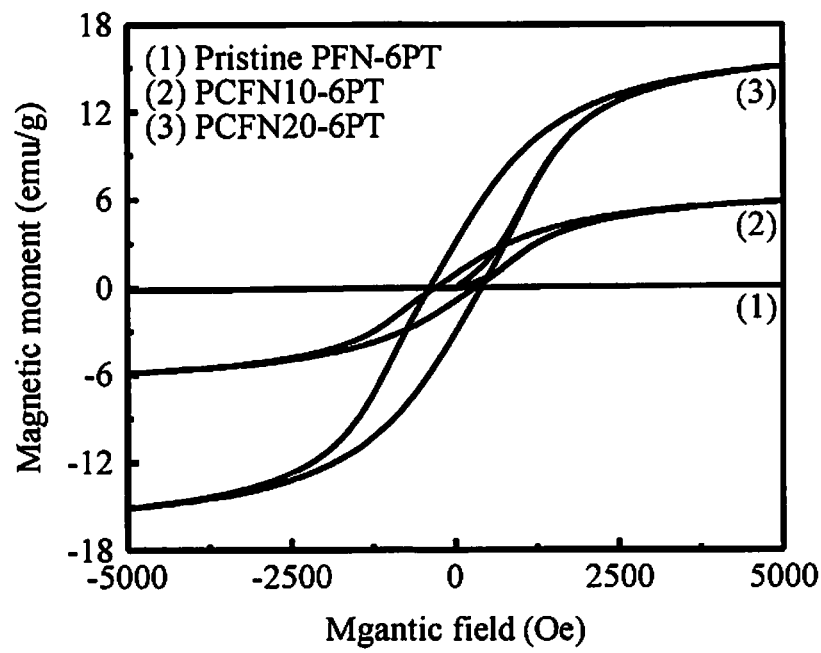
FIG. 10 is a graph showing magnetization properties of multiferroicity materials according to Comparative Example and Examples 3 and 4 of the present disclosure (when replacing lead with cobalt).

FIG. 9 is a graph showing magnetization properties of multiferroicity materials according to Comparative Example and Examples 1 and 2 of the present disclosure (when replacing lead with nickel), and FIG. 10 is a graph showing magnetization properties of multiferroicity materials according to Comparative Example and Examples 3 and 4 of the present disclosure (when replacing lead with cobalt).

Referring to FIGS. 9 and 10, as results of applying magnetic fields ranging from −10000 to +10000 Oe to 0.94$(Pb_{0.9}Ni_{0.1}Fe_{1/2}Nb_{1/2}O_3)$-0.06$(PbTiO_3)$, 0.94$(Pb_{0.9}Ni_{0.2}Fe_{1/2}Nb_{1/2}O_3)$-0.06$(PbTiO_3)$, 0.94$(Pb_{0.9}Co_{0.1}Fe_{1/2}Nb_{1/2}O_3)$-0.06$(PbTiO_3)$, and 0.94$(Pb_{0.9}Co_{0.2}Fe_{1/2}Nb_{1/2}O_3)$-0.06$(PbTiO_3)$ respectively, it can be seen that magnetic properties were changed from antiferromagnetism to ferromagnetism as ferromagnetic hysteresis loops appeared in room-temperature multiferroicity compounds which were each substituted with nickel and cobalt. The lead-iron-niobium-based compounds before the ferromagnetic materials are substituted showed linear paramagnetic behaviors, whereas they showed typical ferromagnetic hysteresis loops with saturation after being substituted with nickel or cobalt among the ferromagnetic materials. It can be seen that nickel induced soft ferromagnetism and cobalt induced hard ferromagnetism in the lead-iron-niobium-based compounds by changes in the coercive force and saturation magnetic field.

Further, saturation magnetization numerical values increased as the substitution of ferromagnetic elements increased in all compositions. In particular, ferromagnetic properties were increased about four times in the phase boundary composition compared to an existing 0.94$(PbFe_{1/2}Nb_{1/2}O_3)$-0.06 $(PbTiO_3)$ material that did not include a tetragonal $ABO_3$ crystal structure, particularly, when Ni or Co with a smaller amount was substituted.

Figure 11:
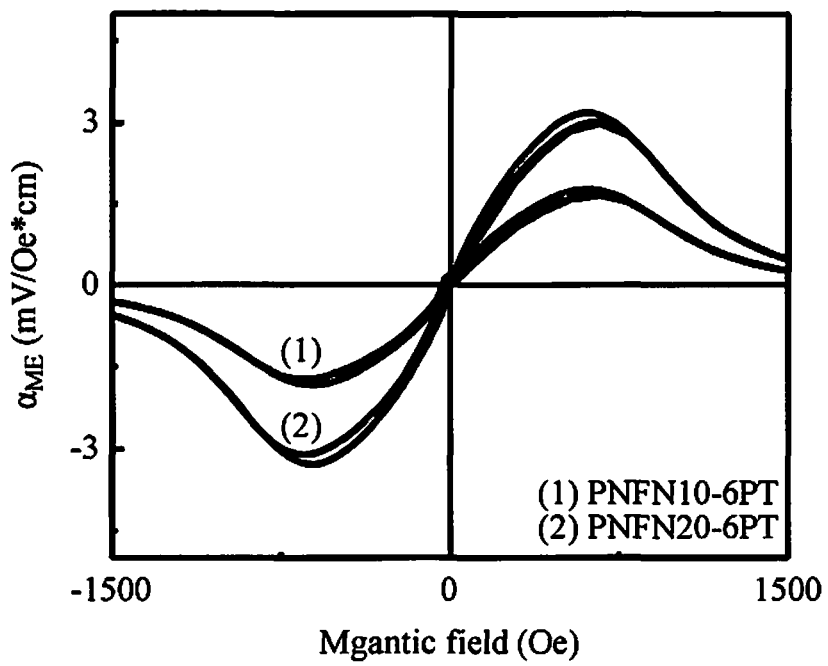
FIG. 11 is a graph showing magnetoelectric properties at room temperature of room-temperature multiferroicity materials according to Examples 1 and 2 of the present disclosure (when replacing lead with nickel).

FIG. 11 is a graph showing magnetoelectric properties at room temperature of room-temperature multiferroicity materials according to Examples 1 and 2 of the present disclosure (when replacing lead with nickel). Referring to FIG. 11, as results of applying magnetic fields ranging from −1500 to +1500 Oe to 0.94$(Pb_{0.9}Ni_{0.1}Fe_{1/2}Nb_{1/2}O_3)$-0.06 $(PbTiO_3)$ and 0.94$(Pb_{0.9}Ni_{0.2}Fe_{1/2}Nb_{1/2}O_3)$-0.06$(PbTiO_3)$, clear magnetoelectric coupling effects were shown depending on the magnetic field at room temperature.

Figure 12:
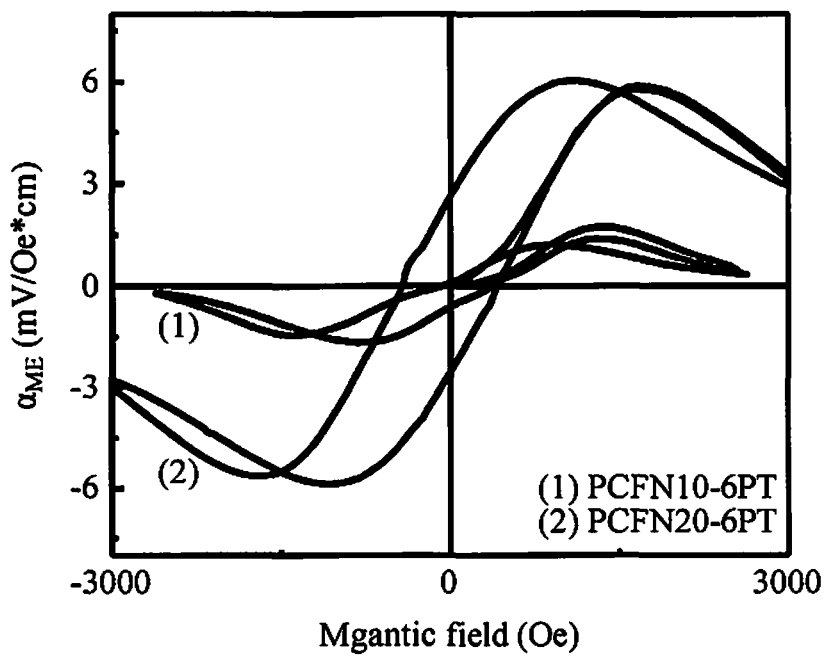
FIG. 12 is a graph showing magnetoelectric properties at room temperature of room-temperature multiferroicity materials according to Examples 3 and 4 of the present disclosure (when replacing lead with cobalt).

FIG. 12 is a graph showing magnetoelectric properties at room temperature of room-temperature multiferroicity materials according to Examples 3 and 4 of the present disclosure (when replacing lead with cobalt). Referring to 12, as results of applying magnetic fields ranging from −3000 to +3000 Oe to 0.94$(Pb_{0.9}Co_{0.1}Fe_{1/2}Nb_{1/2}O_3)$-0.06 $(PbTiO_3)$ and 0.94$(Pb_{0.9}Co_{0.2}Fe_{1/2}Nb_{1/2}O_3)$-0.06$(PbTiO_3)$, clear magnetoelectric coupling effects were shown depending on the magnetic field at room temperature than $ABO_3$+ 1aN according to Example 1.

It has been confirmed that a room-temperature multiferroicity material according to an example embodiment of the present disclosure may manufacture a multiferroicity ceramic which forms a morphotropic phase boundary (MPB), and has a bulk shape at the same time while having a single phase having a strong combination of ferromagnetism and ferroelectricity operable at room temperature.

Although the example embodiments have been described with reference to the limited Examples and drawings as described above, various modifications and variations are possible from the above description by one of ordinary skill in the art. For example, appropriate results can be achieved although described techniques are performed in order different from a described method, and/or described elements are joined or combined in a form different from the described method, or replaced or substituted by other elements or equivalents. Therefore, other implementations, other example embodiments, and equivalents to the scope of claims also belong to the scope of the claims described later.

The invention claimed is:

1. A room-temperature multiferroicity material comprising a compound of Chemical Formula 2 below in a compound matrix of Chemical Formula 1 below:

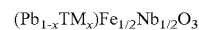 [Chemical Formula 1]

wherein in Chemical Formula 1, TM includes at least one selected from the group consisting of Fe, Ni, and Co, and x is a number greater than 0 and less than 1

 [Chemical Formula 2]

wherein in Chemical Formula 2, A includes at least one selected from the group consisting of Pb, Bi, and Ba, and B includes Ti, Zr, or both.

2. The room-temperature multiferroicity material of claim 1, wherein the room-temperature multiferroicity material is composed of a single phase.

3. The room-temperature multiferroicity material of claim 1, wherein the room-temperature multiferroicity material has an $ABO_3$ perovskite structure.

4. The room-temperature multiferroicity material of claim 1, wherein the room-temperature multiferroicity material exhibits a morphotropic phase boundary (MPB) between rhombohedral and tetragonal multiferroic polymorphs.

5. The room-temperature multiferroicity material of claim 4, wherein the rhombohedral and tetragonal structures have a phase fraction ratio of 40:60 to 60:40.

6. The room-temperature multiferroicity material of claim 4, wherein the phase boundary is confirmed at 0 to 400° C.

7. The room-temperature multiferroicity material of claim 1, wherein the room-temperature multiferroicity material has a higher saturation magnetization and a higher magnetoelectric coefficient than $PbFe_{1/2}Nb_{1/2}O_3$.

8. The room-temperature multiferroicity material of claim 1, wherein the room-temperature multiferroicity material has both ferromagnetism and ferroelectricity.

9. The room-temperature multiferroicity material of claim 1, wherein the room-temperature multiferroicity material has a polarization of 16 $nC/cm^2$ or more and a coercive electric field of 300 V/cm or more.

10. The room-temperature multiferroicity material of claim 1, wherein the room-temperature multiferroicity material has a saturation magnetization of 3 emu/g or more and a coercive force of 50 mOe or more.

11. The room-temperature multiferroicity material of claim 1, wherein the room-temperature multiferroicity material has piezoelectricity, and
the room-temperature multiferroicity material has a piezoelectric constant (d33) of 50 to 1000 pC/N.

12. An electronic device comprising the room-temperature multiferroicity material of claim 1.

13. A method for preparing a room-temperature multiferroicity material, the method comprising steps of:
forming a first mixture by mixing a lead oxide, an iron oxide, a niobium oxide, and a ferromagnetic element;
forming a second mixture by mixing a lead oxide, a bismuth oxide or a barium oxide, and a titanium oxide, a zinc oxide, or both thereof;
mixing the first mixture and the second mixture to obtain a mixed mixture;
calcining the mixed mixture to obtain a calcined mixture; and
sintering the calcined mixture,
wherein the room-temperature multiferroicity material includes a compound of Chemical Formula 2 below in a compound matrix of Chemical Formula 1 below:

$$(Pb_{1-x}TM_x)Fe_{1/2}Nb_{1/2}O_3 \quad \text{[Chemical Formula 1]}$$

wherein in Chemical Formula 1, TM includes at least one selected from the group consisting of Fe, Ni, and Co, and x is a number greater than 0 and less than 1

$$ABO_3 \quad \text{[Chemical Formula 2]}$$

wherein in Chemical Formula 2, A includes Pb, Bi, or Ba, and B includes Ti, Zr, or both.

14. The method of claim 13, wherein
the method further comprises a step of performing first ball milling of the mixture, between the step of mixing the first mixture and the second mixture and the step of calcining the mixture, and
the method further comprises a step of performing second ball milling of the mixture, between the step of calcining the mixture to obtain the calcined mixture and the step of sintering the calcined mixture.

15. The method of claim 13, further comprising:
a step of press-molding the mixture to form pellets before performing the step of sintering the calcined mixture.

16. The method of claim 13, wherein
the calcination step is performed at a temperature ranging from 600 to 900° C. for a period ranging from 1 to 6 hours, and
the sintering step is performed at a temperature ranging from 900 to 1200° C. for a period ranging from 1 to 6 hours.

17. The method of claim 13, wherein the calcination step and the sintering step are performed in the air or in an inert atmosphere.

18. The method of claim 13, wherein the lead oxide includes PbO, the iron oxide includes $Fe_2O_3$, and the niobium oxide includes $Nb_2O_5$.

19. The method of claim 13, wherein the ferromagnetic element includes at least one selected from the group consisting of $Fe_2O_3$, NiO, and $CoCO_3$.

20. The method of claim 13, wherein the bismuth oxide includes $Bi_2O_3$, the barium oxide includes BaO, the titanium oxide Includes $TiO_2$, and zinc oxide $ZrO_2$ is included.

* * * * *